(12) United States Patent
Hsu et al.

(10) Patent No.: US 12,027,545 B2
(45) Date of Patent: Jul. 2, 2024

(54) SENSOR PACKAGE STRUCTURE

(71) Applicant: KINGPAK TECHNOLOGY INC., Hsin-Chu County (TW)

(72) Inventors: Jui-Hung Hsu, Hsin-Chu County (TW); Chien-Chen Lee, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 404 days.

(21) Appl. No.: 17/560,176

(22) Filed: Dec. 22, 2021

(65) Prior Publication Data

US 2022/0359593 A1    Nov. 10, 2022

Related U.S. Application Data

(60) Provisional application No. 63/184,622, filed on May 5, 2021.

(30) Foreign Application Priority Data

Oct. 20, 2021   (TW) ................................ 110138792

(51) Int. Cl.
*H01L 27/146*   (2006.01)
*H01L 23/00*   (2006.01)
(Continued)

(52) U.S. Cl.
CPC ........ *H01L 27/14618* (2013.01); *H01L 23/29* (2013.01); *H01L 23/3128* (2013.01);
(Continued)

(58) Field of Classification Search
None
See application file for complete search history.

(56) References Cited

U.S. PATENT DOCUMENTS 3,622,419 A * 11/1971 London .................... H01L 23/16
257/E31.118
5,343,076 A * 8/1994 Katayama ............. H01L 23/057
257/E23.047
(Continued)

FOREIGN PATENT DOCUMENTS

CN       107591420 A * 1/2018  ........ H01L 23/49811
CN       108336028 A * 7/2018  ............. H01L 21/50
(Continued)

*Primary Examiner* — Scott B Geyer
(74) *Attorney, Agent, or Firm* — Li & Cai Intellectual Property Office

(57) ABSTRACT

A sensor package structure is provided. The sensor package structure includes a substrate, a sensor chip disposed on the substrate, a plurality of wires electrically coupling the sensor chip to the substrate, a supporting colloid layer disposed on the substrate, and a light-permeable sheet that is disposed on the supporting colloid layer. The substrate has a first board surface and a second board surface that is opposite to the first board surface. The substrate has a chip-accommodating slot recessed in the first board surface. The sensor chip is disposed in the chip-accommodating slot, and a gap distance between a top surface of the sensor chip and the first board surface is less than or equal to 10 μm. The supporting colloid layer is ring-shaped and is disposed on the first board surface, and each of the wires is at least partially embedded in the supporting colloid layer.

11 Claims, 7 Drawing Sheets

(51) Int. Cl.
*H01L 23/29* (2006.01)
*H01L 23/31* (2006.01)

(52) U.S. Cl.
CPC ........ *H01L 23/315* (2013.01); *H01L 23/3157* (2013.01); *H01L 23/3171* (2013.01); *H01L 24/48* (2013.01); *H01L 27/14636* (2013.01); *H01L 2224/48091* (2013.01); *H01L 2224/48101* (2013.01); *H01L 2224/48105* (2013.01); *H01L 2224/48158* (2013.01); *H01L 2224/48228* (2013.01); *H01L 2924/18165* (2013.01)

(56) References Cited

U.S. PATENT DOCUMENTS

| | | | | |
|---|---|---|---|---|
| 5,552,635 | A * | 9/1996 | Kim | H01L 23/42 257/E23.09 |
| 2004/0048421 | A1 * | 3/2004 | Noguchi | H01L 23/24 438/128 |
| 2008/0191335 | A1 * | 8/2008 | Yang | H01L 21/6835 257/E23.18 |
| 2011/0049557 | A1 * | 3/2011 | Meng | H01L 27/14618 257/E33.056 |
| 2011/0127655 | A1 * | 6/2011 | Fujii | H01L 23/04 257/664 |
| 2011/0204465 | A1 * | 8/2011 | Meng | H01L 27/14683 257/434 |
| 2012/0313203 | A1 * | 12/2012 | Fuse | H01L 24/97 257/E31.127 |
| 2013/0187263 | A1 * | 7/2013 | Lin | H01L 23/12 257/729 |
| 2014/0124962 | A1 * | 5/2014 | Scheid | H01L 24/32 257/E21.705 |
| 2015/0035133 | A1 * | 2/2015 | Wong | H01L 24/97 438/114 |
| 2017/0243803 | A1 * | 8/2017 | Lin | H01L 21/4807 |
| 2018/0012919 | A1 * | 1/2018 | Tu | H01L 27/14618 |
| 2019/0057992 | A1 * | 2/2019 | Chen | H01L 27/14636 |
| 2019/0065820 | A1 * | 2/2019 | Lu | H01L 23/13 |
| 2019/0139843 | A1 * | 5/2019 | Shigeta | H01L 23/12 |
| 2019/0393113 | A1 * | 12/2019 | Chen | H01L 27/14625 |
| 2022/0044981 | A1 * | 2/2022 | Murdock | H01L 23/291 |

FOREIGN PATENT DOCUMENTS

| | | | | |
|---|---|---|---|---|
| CN | 112038299 A | * | 12/2020 | ......... H01L 23/3107 |
| TW | 200848832 A | | 12/2008 | |
| WO | WO-2014207786 A1 | * | 12/2014 | ......... H01L 23/3142 |
| WO | WO-2016069560 A1 | * | 5/2016 | ........... B81B 7/0077 |

* cited by examiner

SENSOR PACKAGE STRUCTURE

CROSS-REFERENCE TO RELATED PATENT APPLICATION

This application claims the benefit of priority to Taiwan Patent Application No. 110138792, filed on Oct. 20, 2021. The entire content of the above identified application is incorporated herein by reference.

This application claims priority to the U.S. Provisional Patent Application Ser. No. 63/184,622 filed on May 5, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a substrate and a sensor chip that is disposed on the substrate. Moreover, soldering pads of the substrate and connection pads of the sensor chip are connected to each other by wires that are formed in a wire bonding manner. However, since a height of each of the wires needs to be greater than a height of the sensor chip, a distance between two ends of each of the wires (or a distance between any one of the soldering pads and a corresponding one of the connection pads) would be limited by the height of the wires and cannot be further reduced (e.g., the distance between any one of the soldering pads and a corresponding one of the connection pads is at least 200 μm).

SUMMARY OF THE DISCLOSURE

In response to the above-referenced technical inadequacies, the present disclosure provides a sensor package structure, so as to effectively improve on the issues associated with a conventional sensor package structure.

In one aspect, the present disclosure provides a sensor package structure, which includes a substrate, a sensor chip, a plurality of wires, a supporting colloid layer, and a light-permeable sheet. The substrate has a first board surface and a second board surface that is opposite to the first board surface. The substrate has a chip-accommodating slot recessed in the first board surface, and the substrate includes a plurality of soldering pads arranged on the first board surface and outside of the chip-accommodating slot. The sensor chip includes a sensing region that is arranged on a top surface thereof and a plurality of connection pads that are arranged on the top surface and outside of the sensing region. The sensor chip is disposed in the chip-accommodating slot, and a gap distance between the top surface and the first board surface is less than or equal to 10 μm. The wires respectively and electrically couple the connection pads to the soldering pads. The supporting colloid layer is ring-shaped and is disposed on the first board surface. Each of the wires is at least partially embedded in the supporting colloid layer. The light-permeable sheet is disposed on the supporting colloid layer, so as to form an enclosed space in the sensor package structure. The sensing region is arranged in the enclosed space and faces toward the light-permeable sheet.

Therefore, in the sensor package structure provided by the present disclosure, since the sensor chip is disposed in the chip-accommodating slot of the substrate under a specific condition (e.g., the gap distance is less than or equal to 10 m), formation of each of the wires is no longer limited by a height of the sensor chip, thereby allowing a distance between any one of the soldering pads and its corresponding connection pad to be reduced and an overall size of the sensor package structure to be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
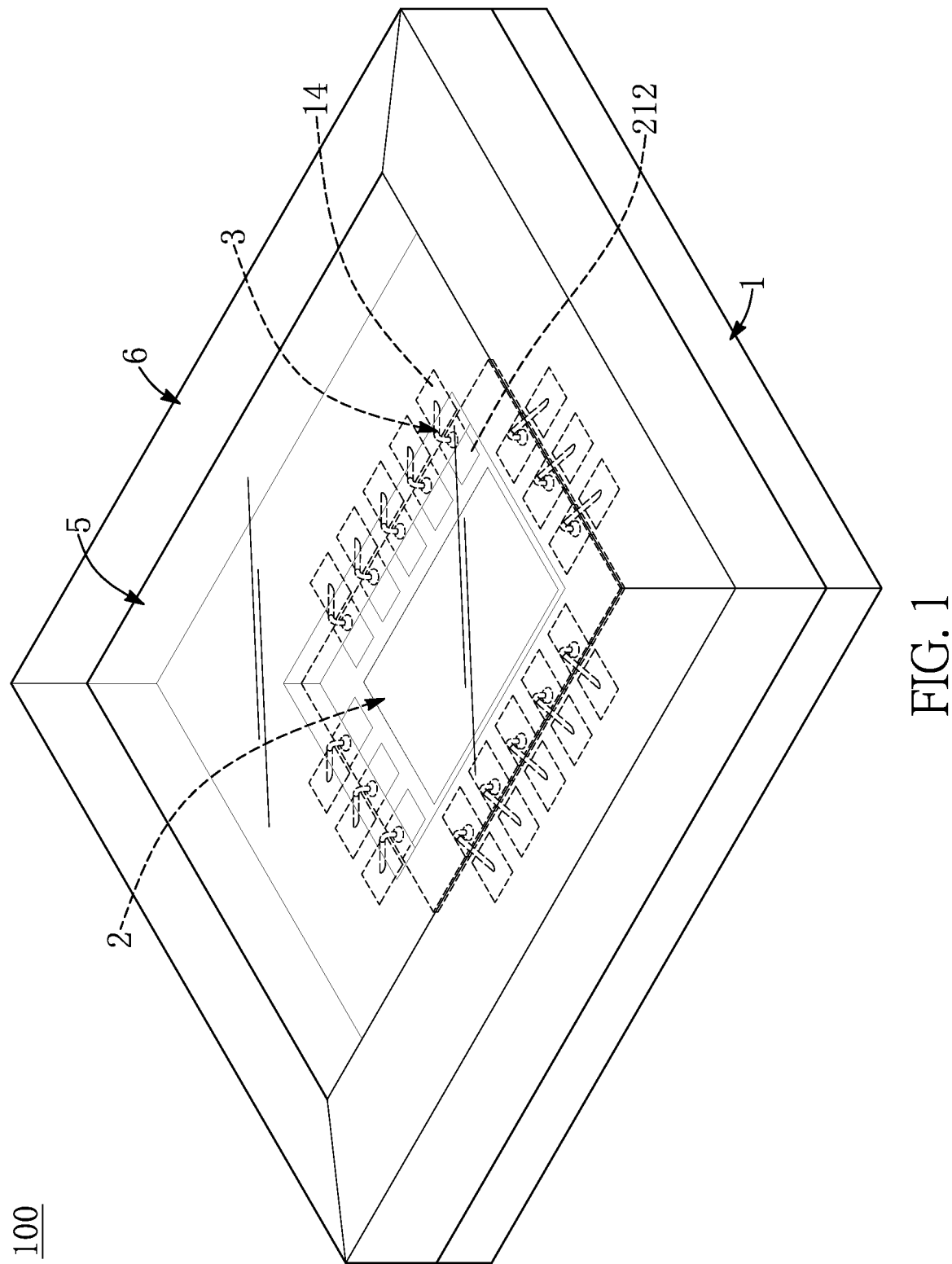
FIG. 1 is a perspective view of a sensor package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
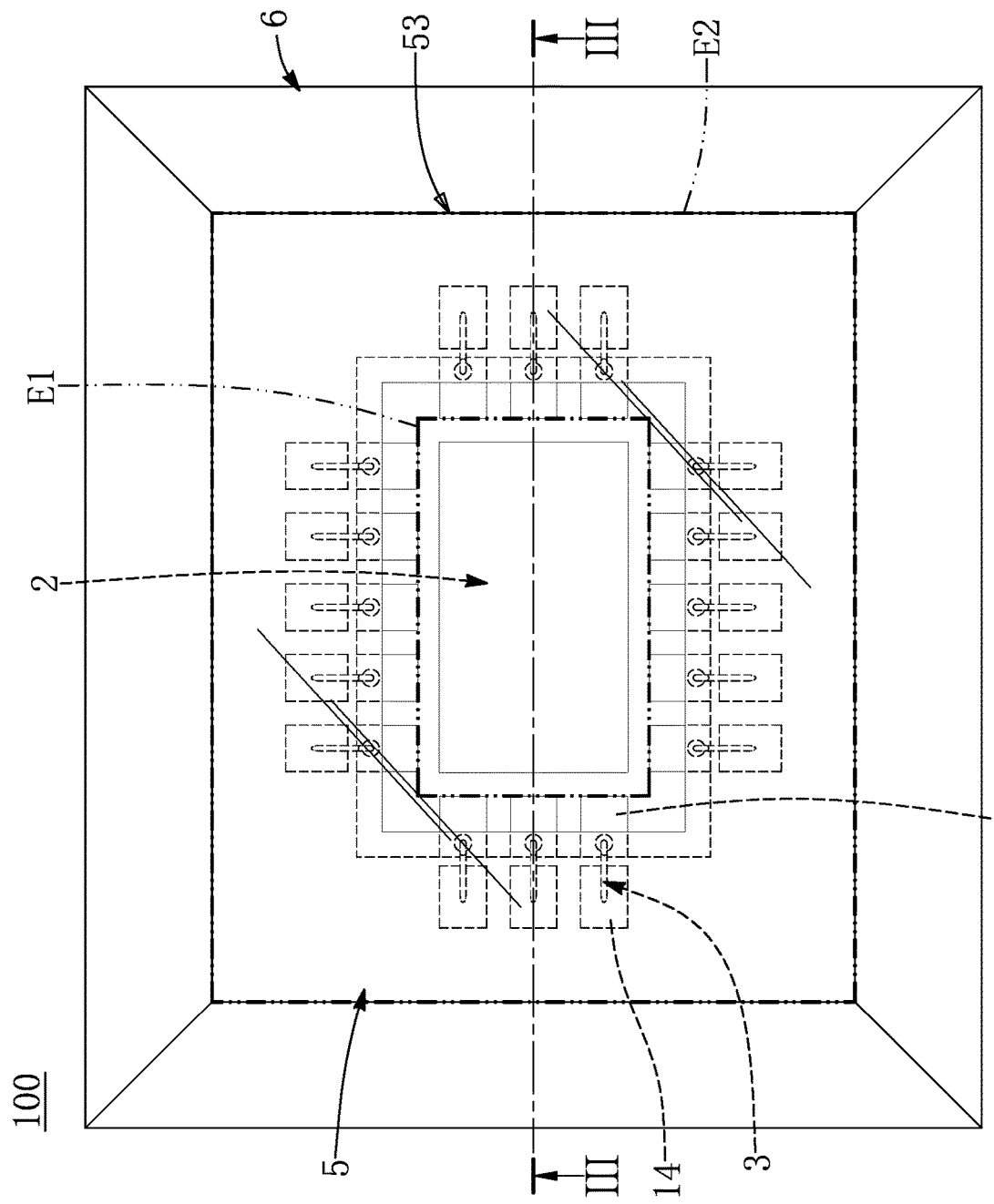
FIG. 2 is a top view of FIG. 1.

Reference is made to FIG. 1 to FIG. 7, which show an embodiment of the present disclosure. As shown in FIG. 1 and FIG. 2, the present embodiment provides a sensor package structure 100. In other words, any package structure that is not used for packaging a sensor chip has a structural design different from that of the sensor package structure 100 of the present embodiment.

Figure 3:
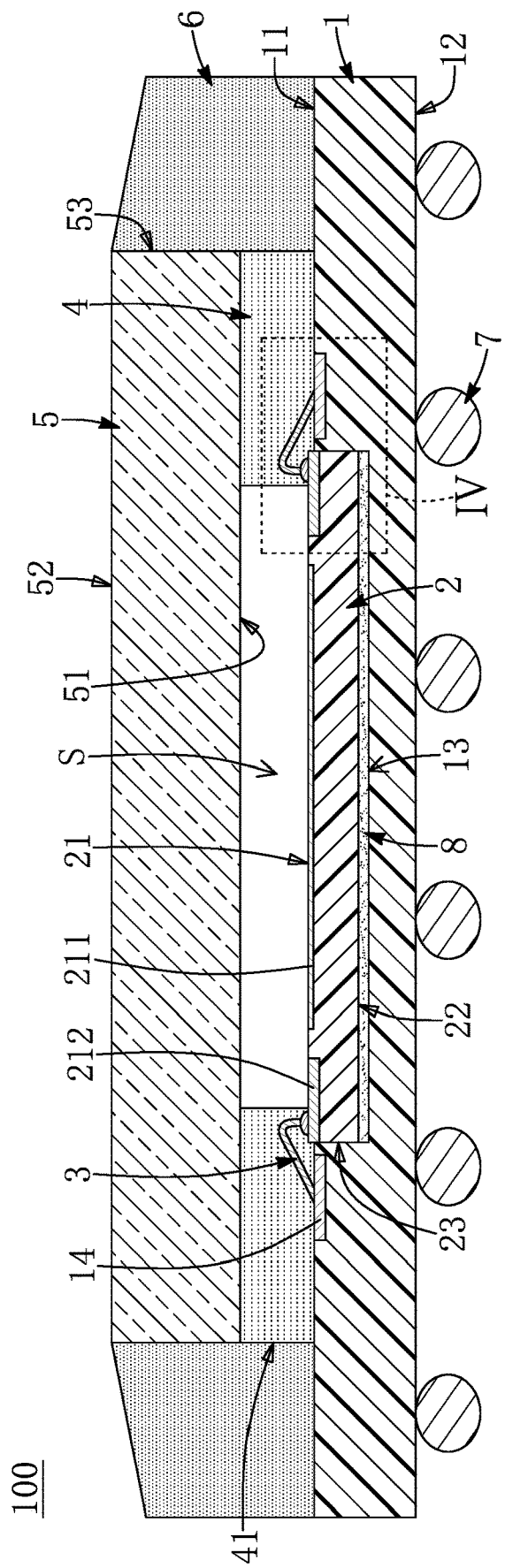
FIG. 3 is a cross-sectional view taken along line III-III of FIG. 2.
Figure 4:
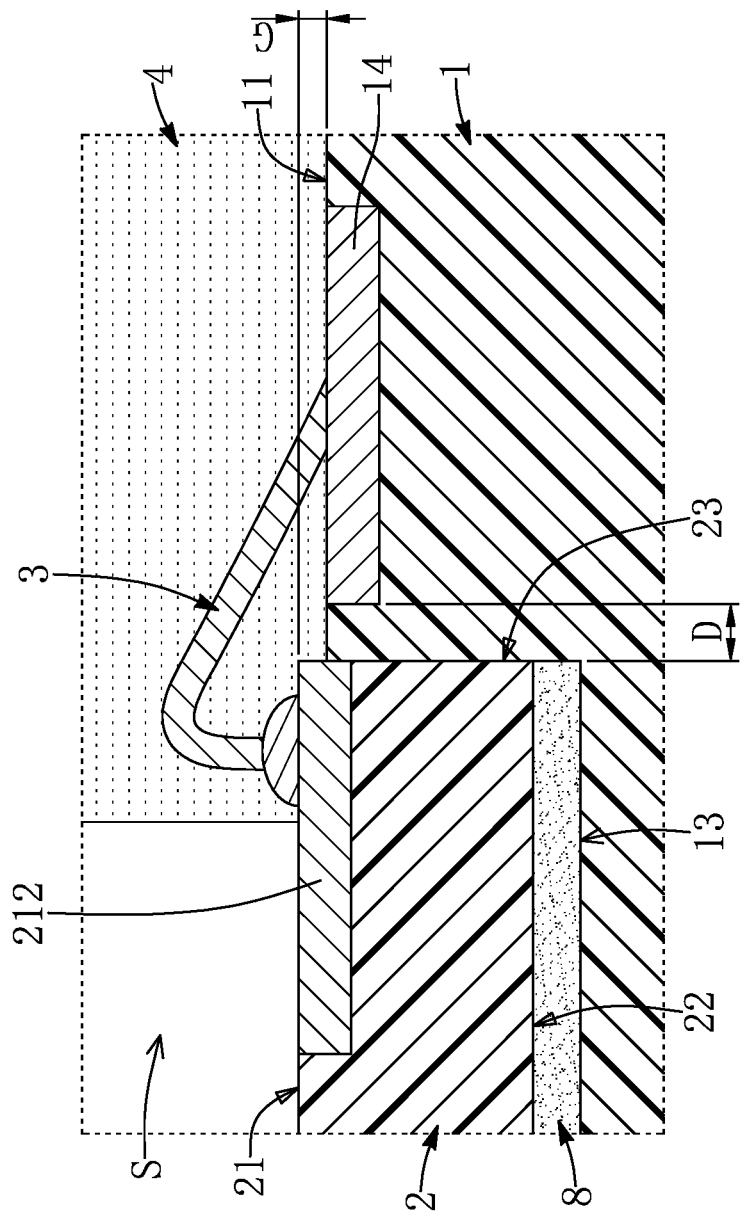
FIG. 4 is an enlarged view of part IV of FIG. 3.

As shown in FIG. 2 to FIG. 4, the sensor package structure 100 in the present embodiment includes a substrate 1, a sensor chip 2 disposed on the substrate 1, a plurality of wires 3 electrically coupling the sensor chip 2 to the substrate 1, a supporting colloid layer 4 disposed on the substrate 1 (and the sensor chip 2), a light-permeable sheet 5 disposed on the supporting colloid layer 4, and a package body 6 that is formed on the substrate 1.

The sensor package structure 100 in the present embodiment includes the above components, but can be adjusted or changed according to design requirements. For example, in other embodiments of the present disclosure (not shown in the drawings), the sensor package structure 100 can be provided without the package body 6.

The substrate 1 in the present embodiment is in a rectangular shape, but the present disclosure is not limited thereto. The substrate 1 has a first board surface 11 and a second board surface 12 that is opposite to the first board surface 11. The substrate 1 has a chip-accommodating slot 13 recessed in the first board surface 11, and the substrate 1 includes a plurality of soldering pads 14 arranged on the first board surface 11. In the present embodiment, the soldering pads 14 are arranged outside of the chip-accommodating slot 13 and are in a ring-shaped arrangement. Each of the soldering pads 14 is spaced apart from the chip-accommodating slot 13 by a spacing distance D that is preferably less than or equal to 100 μm, but the present disclosure is not limited thereto.

In addition, a plurality of soldering balls 7 can be further provided on the second board surface 12 of the substrate 1. The substrate 1 can be soldered and fixed onto an electronic component (not shown in the drawings) through the soldering balls 7, thereby assembling and electrically connecting the sensor package structure 100 to the electronic component.

Figure 5:
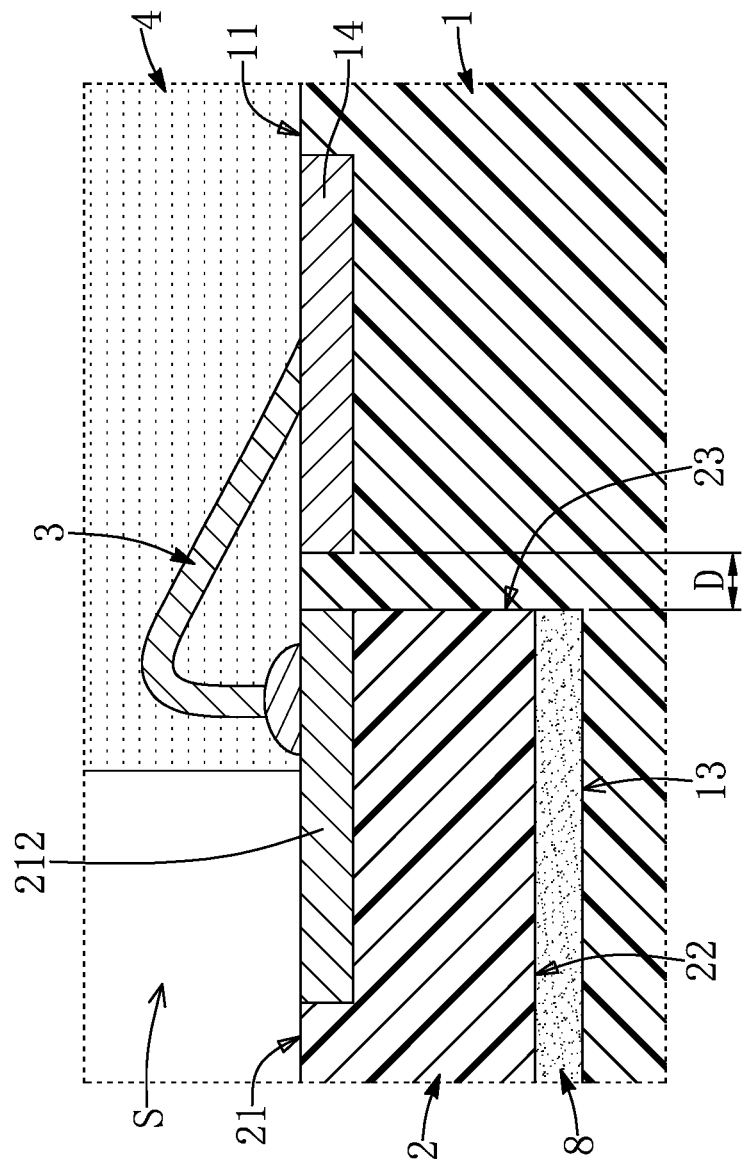
FIG. 5 is an enlarged view of part IV of FIG. 3 in another configuration.

The sensor chip 2 in the present embodiment is an image sensor chip, but the present disclosure is not limited thereto. The sensor chip 2 is disposed in the chip-accommodating slot 13 of the substrate 1 (e.g., a bottom surface 22 of the sensor chip 2 faces a bottom of the chip-accommodating slot 13), and a top surface 21 of the sensor chip 2 and the first board surface 11 have a gap distance G there-between that is less than or equal to 10 μm. In other words, the gap distance G can be less than or equal to 5 μm, and is preferably 0 (e.g., as shown in FIG. 5, the top surface 21 of the sensor chip 2 is coplanar with the first board surface 11 of the substrate 1).

As shown in FIG. 2 to FIG. 4, the sensor package structure 100 in the present embodiment includes an adhesive layer 8 disposed in the chip-accommodating slot 13, and the sensor chip 2 is fixed in the chip-accommodating slot 13 through the adhesive layer 8 (e.g., the bottom surface 22 of the sensor chip 2 and the bottom of the chip-accommodating slot 13 are adhered and fixed to each other through the adhesive layer 8), but the present disclosure is not limited thereto. For example, in other embodiments of the present disclosure (not shown in the drawings), the adhesive layer 8 can be omitted or can be replaced by other components.

Moreover, the top surface 21 of the sensor chip 2 includes a sensing region 211 and a plurality of connection pads 212 that are located outside of the sensing region 211. In the present embodiment, preferably, the connection pads 212 respectively correspond in position to the soldering pads 14. Moreover, an outer edge of each of the connection pads 212 is arranged on an outer lateral surface 23 of the sensor chip 2, and is spaced apart from a corresponding one of the soldering pads 14 by a distance that is less than or equal to 100 μm (which is substantially identical to the spacing distance D). However, the present disclosure is not limited thereto.

For example, in other embodiments of the present disclosure (not shown in the drawings), the outer edge of each of the connection pads 212 can be located inside of the outer lateral surface 23 of the sensor chip 2, so that the distance between the outer edge of each of the connection pads 212 and its corresponding soldering pad 14 can be greater than the spacing distance D.

Specifically, in the present embodiment, the connection pads 212 are provided on the top surface 21 in a ring-shaped arrangement and surround the sensing region 211, but the present disclosure is not limited thereto. For example, in other embodiments of the present disclosure (not shown in the drawings), the connection pads 212 can be arranged into two rows that are respectively located at two opposite sides of the sensing region 211, the soldering pads 14 can also be arranged into two rows that are respectively located at two opposite sides of the chip-accommodating slot 13, and the connection pads 212 respectively correspond in position to the soldering pads 14.

The wires 3 electrically couple the connection pads 212 to the soldering pads 14, respectively. In other words, each of the wires 3 is formed in a wire bonding manner, and two ends of each of the wires 3 are connected to one of the soldering pads 14 and a corresponding one of the connection pads 212, respectively.

Accordingly, in the sensor package structure 100 of the present embodiment, since the sensor chip 2 is disposed in the chip-accommodating slot 13 of the substrate 1 under a specific condition (e.g., the gap distance G is less than or equal to 10 μm), formation of each of the wires 3 is no longer limited by a height of the sensor chip 2, thereby allowing a distance between any one of the soldering pads 14 and its corresponding connection pad 212 to be reduced.

The supporting colloid layer 4 is in a ring-shape and is disposed on the first board surface 11 of the substrate 1 (and a part of the top surface 21 of the sensor chip 2), and the supporting colloid layer 4 surrounds an outer side of the chip-accommodating slot 13. The light-permeable sheet 5 is disposed on the supporting colloid layer 4 (that is, the supporting colloid layer 4 is sandwiched between the first board surface 11 of the substrate 1 and an inner surface 51 of the light-permeable sheet 5), so as to form an enclosed space S in the sensor package structure 100. Moreover, the sensing region 211 is arranged in the enclosed space S and faces toward the light-permeable sheet 5. In addition, the package body 6 is disposed on the first board surface 11 of the substrate 1, and is connected to and covers an outer lateral side 41 of the supporting colloid layer 4 and an outer lateral surface 53 of the light-permeable sheet 5, but an outer surface 52 of the light-permeable sheet 5 is exposed from the package body 6.

In summary, the sensor chip 2 of the sensor package structure 100 in the present embodiment is disposed in the chip-accommodating slot 13 of the substrate 1 under a specific condition (e.g., the gap distance G is less than or equal to 10 μm), so that the sensor package structure 100 can provide a larger distribution region for arrangement of the supporting colloid layer 4. Accordingly, the supporting colloid layer 4 can have different distribution manners according to design requirements.

Specifically, inner edges of the connection pads 212 that are in the ring-shaped arrangement jointly define an inner distribution boundary E1, and a projection region defined by orthogonally projecting the outer lateral surface 53 of the light-permeable sheet 5 onto the first board surface 11 defines an outer distribution boundary E2. Moreover, the supporting colloid layer 4 can be disposed on at least part of a region between the inner distribution boundary E1 and the outer distribution boundary E2.

Figure 6:
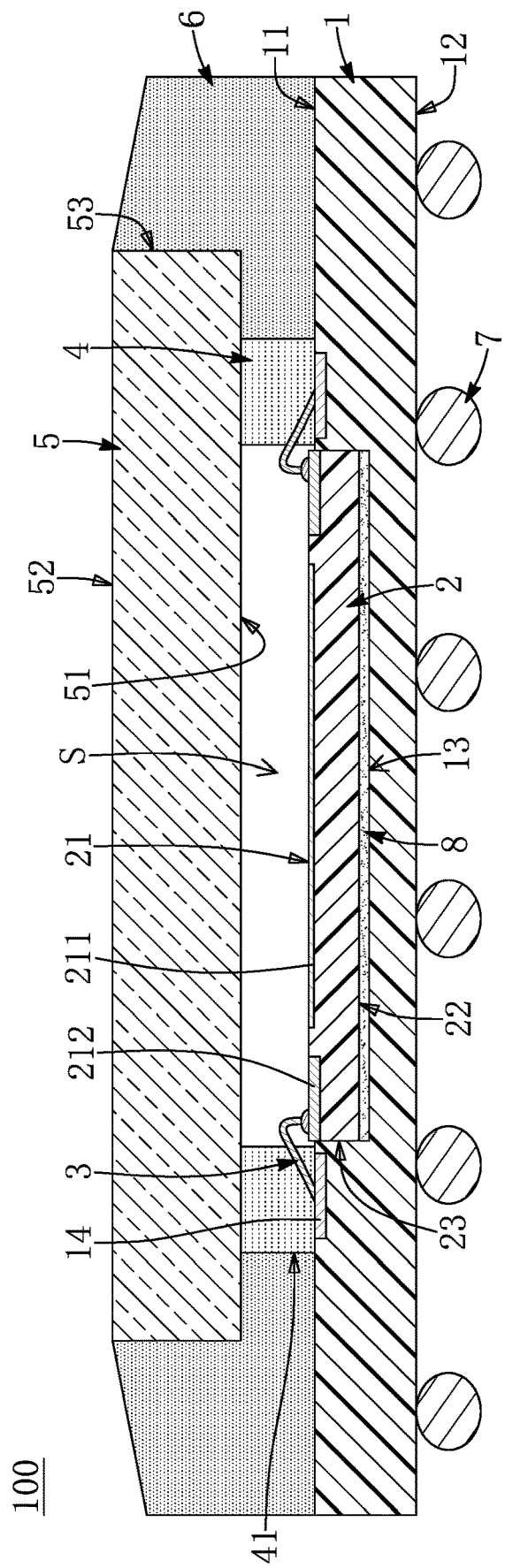
FIG. 6 is a cross-sectional view of the sensor package structure in another configuration according to the embodiment of the present disclosure.
Figure 7:
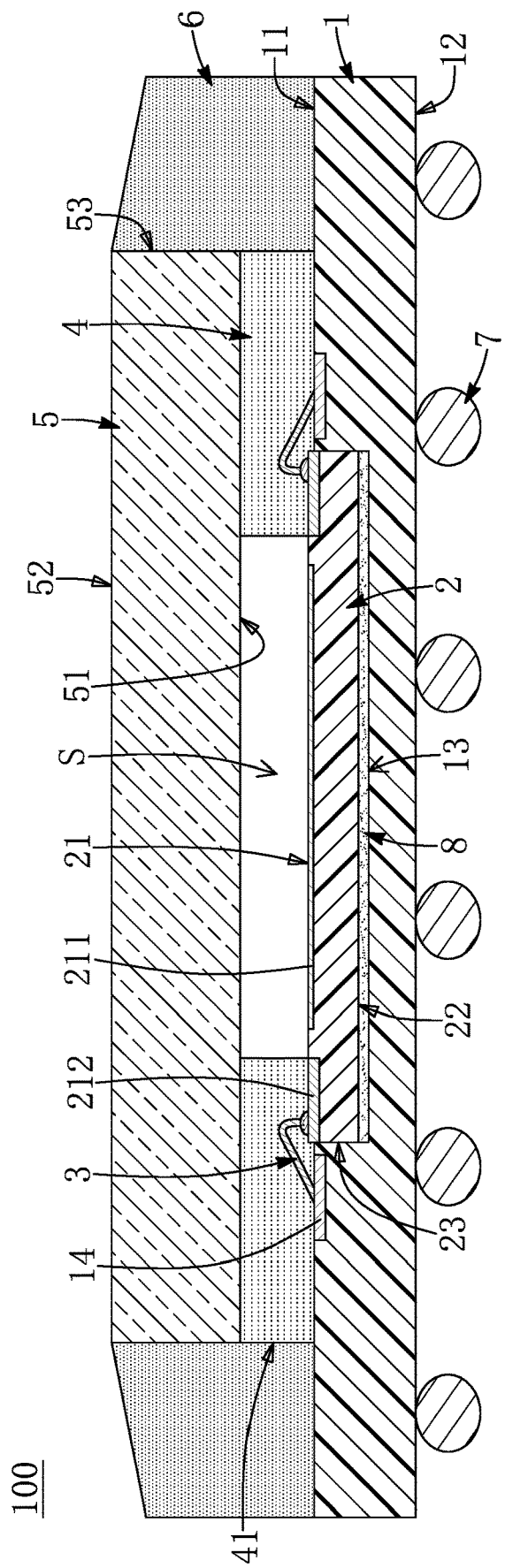
FIG. 7 is a cross-sectional view of the sensor package structure in yet another configuration according to the embodiment of the present disclosure.

In other words, when the supporting colloid layer 4 is disposed on the region between the inner distribution boundary E1 and the outer distribution boundary E2, a specific position and a volume of the supporting colloid layer 4 can be changed or adjusted according to design requirements. For example, as shown in FIG. 6, the supporting colloid layer 4 can be disposed on the substrate 1 only, and the soldering pads 14 and at least part of each of the wires 3 are embedded in the supporting colloid layer 4. As shown in FIG. 3, the supporting colloid layer 4 can be disposed on the first board surface 11 of the substrate 1 and be further disposed onto a peripheral portion of the top surface 21 of the sensor chip 2. The supporting colloid layer 4 is located outside of the sensing region 211, and the soldering pads 14 and at least part of each of the connection pads 212 are embedded in the supporting colloid layer 4. As shown in FIG. 7, edges of the supporting colloid layer 4 can be flush with the inner edges of the connection pads 212 (e.g., the inner distribution boundary E1 as shown in FIG. 2) and the outer lateral surface 53 of the light-permeable sheet 5 (e.g., the outer distribution boundary E2 as shown in FIG. 2), so that the wires 3, the connection pads 212, and the soldering pads 14 are embedded in the supporting colloid layer 4.

Beneficial Effects of the Embodiment

In conclusion, in the sensor package structure provided by the present disclosure, since the sensor chip is disposed in the chip-accommodating slot of the substrate under a specific condition (e.g., the gap distance is less than or equal to 10 μm), formation of each of the wires is no longer limited by a height of the sensor chip, thereby allowing a distance between any one of the soldering pads and its corresponding connection pad to be reduced and an overall size of the sensor package structure to be reduced.

Moreover, in the sensor package structure provided by the present disclosure, since the sensor chip is disposed in the chip-accommodating slot of the substrate under a specific condition (e.g., the gap distance is less than or equal to 10 μm), the sensor package structure can provide a larger distribution region for arrangement of the supporting colloid layer. Accordingly, the supporting colloid layer can have different distribution manners according to design requirements.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate having a first board surface and a second board surface that is opposite to the first board surface, wherein the substrate has a chip-accommodating slot recessed in the first board surface, and the substrate includes a plurality of soldering pads arranged on the first board surface and outside of the chip-accommodating slot;
   a sensor chip including a sensing region that is arranged on a top surface thereof and a plurality of connection pads that are arranged on the top surface and outside of the sensing region, wherein the sensor chip is disposed in the chip-accommodating slot, and a gap distance between the top surface and the first board surface is less than or equal to 10 μm;
   a plurality of wires respectively and electrically coupling the connection pads to the soldering pads;
   a supporting adhesive layer, wherein the supporting adhesive layer is ring-shaped and disposed on the first board surface, and each of the wires is at least partially embedded in the supporting adhesive layer; and
   a light-permeable sheet, wherein the light-permeable sheet is disposed on the supporting adhesive layer, so as to form an enclosed space in the sensor package structure; wherein the sensing region is arranged in the enclosed space and faces toward the light-permeable sheet;
   wherein each of the soldering pads is spaced apart from the chip-accommodating slot by a spacing distance that is less than or equal to 100 μm.

2. The sensor package structure according to claim 1, wherein the gap distance is less than or equal to 5 μm.

3. The sensor package structure according to claim 1, wherein the top surface of the sensor chip is coplanar with the first board surface of the substrate.

4. The sensor package structure according to claim 1, wherein the supporting adhesive layer is further disposed on a peripheral portion of the top surface of the sensor chip and is located outside of the sensing region, and each of the soldering pads is at least partially embedded in the supporting adhesive layer.

5. The sensor package structure according to claim 4, wherein the wires and the soldering pads are embedded in the supporting adhesive layer.

6. The sensor package structure according to claim 1, wherein the connection pads are arranged on the top surface in a ring-shaped arrangement, inner edges of the connection pads jointly define an inner distribution boundary, and a projection region defined by orthogonally projecting an outer lateral surface of the light-permeable sheet onto the first board surface defines an outer distribution boundary, and wherein the supporting adhesive layer is disposed on at least part of a region between the inner distribution boundary and the outer distribution boundary.

7. The sensor package structure according to claim 1, wherein the connection pads respectively correspond in position to the soldering pads, and an outer edge of each of the connection pads is arranged on an outer lateral surface of the sensor chip and is spaced apart from a corresponding one of the soldering pads by a distance that is less than or equal to 100 μm.

8. The sensor package structure according to claim 1, further comprising an adhesive layer disposed in the chip-accommodating slot, wherein the sensor chip is fixed in the chip-accommodating slot through the adhesive layer.

9. The sensor package structure according to claim 1, further comprising a package body disposed on the first board surface of the substrate, wherein the package body is connected to and covers an outer lateral side of the supporting adhesive layer and an outer lateral surface of the light-permeable sheet.

10. A sensor package structure, comprising:
- a substrate having a first board surface and a second board surface that is opposite to the first board surface, wherein the substrate has a chip-accommodating slot recessed in the first board surface, and the substrate includes a plurality of soldering pads arranged on the first board surface and outside of the chip-accommodating slot;
- a sensor chip including a sensing region that is arranged on a top surface thereof and a plurality of connection pads that are arranged on the top surface and outside of the sensing region, wherein the sensor chip is disposed in the chip-accommodating slot, and a gap distance between the top surface and the first board surface is less than or equal to 10 μm;
- a plurality of wires respectively and electrically coupling the connection pads to the soldering pads;
- a supporting adhesive layer, wherein the supporting adhesive layer is ring-shaped and disposed on the first board surface, and each of the wires is at least partially embedded in the supporting adhesive layer; and
- a light-permeable sheet, wherein the light-permeable sheet is disposed on the supporting adhesive layer, so as to form an enclosed space in the sensor package structure; wherein the sensing region is arranged in the enclosed space and faces toward the light-permeable sheet;

wherein the supporting adhesive layer is further disposed on a peripheral portion of the top surface of the sensor chip and is located outside of the sensing region, and each of the soldering pads is at least partially embedded in the supporting adhesive layer.

11. A sensor package structure, comprising:
- a substrate having a first board surface and a second board surface that is opposite to the first board surface, wherein the substrate has a chip-accommodating slot recessed in the first board surface, and the substrate includes a plurality of soldering pads arranged on the first board surface and outside of the chip-accommodating slot;
- a sensor chip including a sensing region that is arranged on a top surface thereof and a plurality of connection pads that are arranged on the top surface and outside of the sensing region, wherein the sensor chip is disposed in the chip-accommodating slot, and a gap distance between the top surface and the first board surface is less than or equal to 10 μm;
- a plurality of wires respectively and electrically coupling the connection pads to the soldering pads;
- a supporting adhesive layer, wherein the supporting adhesive layer is ring-shaped and disposed on the first board surface, and each of the wires is at least partially embedded in the supporting adhesive layer; and
- a light-permeable sheet, wherein the light-permeable sheet is disposed on the supporting adhesive layer, so as to form an enclosed space in the sensor package structure; wherein the sensing region is arranged in the enclosed space and faces toward the light-permeable sheet;

wherein the connection pads are arranged on the top surface in a ring-shaped arrangement, inner edges of the connection pads jointly define an inner distribution boundary, and a projection region defined by orthogonally projecting an outer lateral surface of the light-permeable sheet onto the first board surface defines an outer distribution boundary, and wherein the supporting adhesive layer is disposed on at least part of a region between the inner distribution boundary and the outer distribution boundary.

* * * * *